(12) United States Patent
Choi

(10) Patent No.: US 10,304,701 B2
(45) Date of Patent: May 28, 2019

(54) PUMP POSITION FEEDBACK TYPE DISPENSER AND DISPENSING METHOD

(71) Applicant: PROTEC CO., LTD., Gyeonggi-do (KR)

(72) Inventor: Jong Myoung Choi, Incheon (KR)

(73) Assignee: PROTEC CO., LTD., Gyeonggi-do (KR)

( * ) Notice: Subject to any disclaimer, the term of this patent is extended or adjusted under 35 U.S.C. 154(b) by 98 days.

(21) Appl. No.: 15/336,816

(22) Filed: Oct. 28, 2016

(65) Prior Publication Data

US 2017/0120279 A1 May 4, 2017

(30) Foreign Application Priority Data

Oct. 30, 2015 (KR) .................. 10-2015-0151759

(51) Int. Cl.
*B05C 11/10* (2006.01)
*H01L 21/56* (2006.01)
*H01L 21/67* (2006.01)
*B05C 5/02* (2006.01)

(52) U.S. Cl.
CPC .......... *H01L 21/563* (2013.01); *B05C 5/0225* (2013.01); *B05C 11/1015* (2013.01); *B05C 11/1021* (2013.01); *H01L 21/6715* (2013.01); *H01L 21/67253* (2013.01); *H01L 21/67259* (2013.01)

(58) Field of Classification Search
CPC ........................................................ B05C 11/10
See application file for complete search history.

(56) References Cited

U.S. PATENT DOCUMENTS

| | | | | |
|---|---|---|---|---|
| 4,433,795 A * | 2/1984 | Maiefski | ................ | B67D 7/303 222/14 |
| 4,728,074 A * | 3/1988 | Igashira | .............. | F02D 41/2096 123/447 |
| 5,620,519 A * | 4/1997 | Affeldt | .................... | A23P 20/18 118/669 |
| 5,782,410 A * | 7/1998 | Weston | ................. | B05B 12/085 239/583 |
| 6,025,689 A * | 2/2000 | Prentice | ............... | B23Q 1/4852 318/625 |
| 6,168,387 B1 * | 1/2001 | Able | ........................ | F04B 15/02 324/207.16 |
| 6,508,687 B2 * | 1/2003 | Suzuki | .................... | H01J 9/227 313/584 |
| 6,660,091 B2 * | 12/2003 | Ito | ......................... | B05C 5/0212 118/323 |
| 7,753,253 B2 * | 7/2010 | Terada | ................... | H01L 21/563 118/683 |
| 8,051,797 B1 * | 11/2011 | Teichman | ........... | B05B 13/0207 118/500 |
| 8,122,849 B2 * | 2/2012 | Clarke | ..................... | A61J 3/00 118/668 |

(Continued)

*Primary Examiner* — Cachet I Sellman
(74) *Attorney, Agent, or Firm* — JCIPRNET

(57) ABSTRACT

Provided are a pump position feedback type dispenser and dispensing method, in which an image of a work, to which a viscous liquid is to be dispensed, is captured to determine an accurate position and direction of the work, and then a position of a pump is received in real time so as to dispense the viscous liquid to the work while ensuring that the pump reaches the accurate position of the work.

5 Claims, 4 Drawing Sheets

(56) References Cited

U.S. PATENT DOCUMENTS

| | | | |
|---|---|---|---|
| 2002/0009536 A1* | 1/2002 | Iguchi | H01J 9/227 427/10 |
| 2002/0060862 A1* | 5/2002 | Liu | G02B 6/29361 359/811 |
| 2002/0071772 A1* | 6/2002 | Isogai | F04C 11/005 417/292 |
| 2003/0132243 A1* | 7/2003 | Engel | B05C 11/1002 222/61 |
| 2003/0207019 A1* | 11/2003 | Shekalim | B05B 12/12 427/2.24 |
| 2004/0073294 A1* | 4/2004 | Diaz | A61F 2/91 623/1.42 |
| 2004/0081759 A1* | 4/2004 | Maruyama | B05C 5/0216 427/256 |
| 2006/0001866 A1* | 1/2006 | Clarke | G01N 21/95684 356/300 |
| 2006/0003096 A1* | 1/2006 | Hartmann | H01L 21/67132 427/207.1 |
| 2006/0144331 A1* | 7/2006 | Hanafusa | B01L 3/0268 118/712 |
| 2008/0220174 A1* | 9/2008 | Teichman | B05B 12/004 427/427.2 |
| 2010/0129525 A1* | 5/2010 | Shida | H05B 33/10 427/10 |
| 2010/0262230 A1* | 10/2010 | Vecerina | B05B 12/122 623/1.46 |
| 2012/0171372 A1* | 7/2012 | Looi | B05B 13/0431 427/207.1 |
| 2014/0252041 A1* | 9/2014 | Ikushima | B65D 83/0005 222/309 |
| 2015/0093498 A1* | 4/2015 | Reid | H05K 3/0085 427/97.3 |
| 2015/0276534 A1* | 10/2015 | Dunfee | G01N 35/1016 73/700 |
| 2017/0210064 A1* | 7/2017 | Aw | B29C 35/0805 |

* cited by examiner

PUMP POSITION FEEDBACK TYPE DISPENSER AND DISPENSING METHOD

CROSS-REFERENCE TO RELATED APPLICATION

This application claims the benefit of Korean Patent Application No. 10-2015-0151759, filed on Oct. 30, 2015, in the Korean Intellectual Property Office, the disclosure of which is incorporated herein in its entirety by reference.

BACKGROUND

1. Field

One or more exemplary embodiments relate to a pump position feedback type dispenser and dispensing method, and more particularly, to a pump position feedback type dispenser and dispensing method, in which an image of a work, to which a viscous liquid is to be dispensed, is captured to determine an accurate position and direction of the work, and then a position of a pump is received in real time so as to dispense the viscous liquid to the work while ensuring that the pump reaches the accurate position.

2. Description of the Related Art

In an underfill process performed by coating a semiconductor chip with a viscous liquid or a process of coating a light-emitting diode (LED) chip with a phosphorescent solution, dispensers are widely used to coat a work with a viscous liquid.

For dispensers used in semiconductor processes, it is important to quickly coat an accurate amount of viscous liquid at an accurate position.

Some of dispensers according to the related art operate such that a viscous liquid is coated as the dispensers move along a preset path. In this case, if the position and angle of a work vary from preset values, position accuracy of the viscous liquid coated on the work may be degraded.

SUMMARY

One or more exemplary embodiments include a pump position feedback type dispenser and dispensing method, in which an actual position and angle of a work that is disposed are checked so as to coat a viscous liquid at an accurate position, and the viscous liquid may also be quickly coated on a plurality of works.

Additional aspects will be set forth in part in the description which follows and, in part, will be apparent from the description, or may be learned by practice of the presented embodiments.

According to one or more exemplary embodiments, a pump position feedback type dispenser includes: a pump comprising a nozzle, a reservoir connected to the nozzle and storing a viscous liquid to be ejected through the nozzle, a valve rod that is liftably inserted into the reservoir, and an updown unit for moving the valve rod with respect to the reservoir such that the viscous liquid is ejected through the nozzle; a pump moving unit comprising a pump moving portion transporting the pump with respect to a plurality of works such that the pump dispenses the viscous liquid to the plurality of works disposed below the pump and linear encoders mounted in the pump moving portion so as to generate a pump position signal by determining a position of the pump in real time; a camera configured to capture images of the plurality of works to determine positions of the plurality of works disposed below the pump; and a control unit configured to calculate positions of the plurality of the works based on image information captured using the camera, calculate pump operation positions to generate a pump operation signal, via which the viscous liquid is ejected according to an operation of the updown unit of the pump, operate the pump moving portion of the pump moving unit to transport the pump along a path along which the viscous liquid is to be dispensed, so as to receive the pump position signal from the linear encoders in real time, and operate the updown unit of the pump by generating the pump operation signal every time when the pump reaches the pump operation positions.

According to one or more exemplary embodiments, a pump position feedback type dispensing method performed using a pump comprising a nozzle, a reservoir connected to the nozzle and storing a viscous liquid to be ejected through the nozzle, a valve rod that is liftably inserted into the reservoir, and an updown unit for moving the valve rod with respect to the reservoir so that the viscous liquid is ejected through the nozzle is included, wherein the method includes: (a) obtaining image information by capturing images of a plurality of works disposed below the pump, by using a camera; (b) calculating positions of the plurality of works based on the image information and calculating pump operation positions to generate a pump operation signal, via which the viscous liquid is ejected according to an operation of the updown unit of the pump; (c) determining a position of the pump by using the linear encoders in real-time while transporting the pump along a path, along which the viscous liquid is to be dispensed to the works, and generating a pump position signal; and (d) when it is determined that the pump has reached the pump operation positions as the control unit receives the pump position signal from the linear encoders, generating, performed by the control unit, the pump operation signal so as to eject the viscous liquid through the nozzle via an operation of the updown unit.

BRIEF DESCRIPTION OF THE DRAWINGS

These and/or other aspects will become apparent and more readily appreciated from the following description of the embodiments, taken in conjunction with the accompanying drawings in which.

DETAILED DESCRIPTION

The present invention will now be described more fully with reference to the accompanying drawings.

Figure 1:
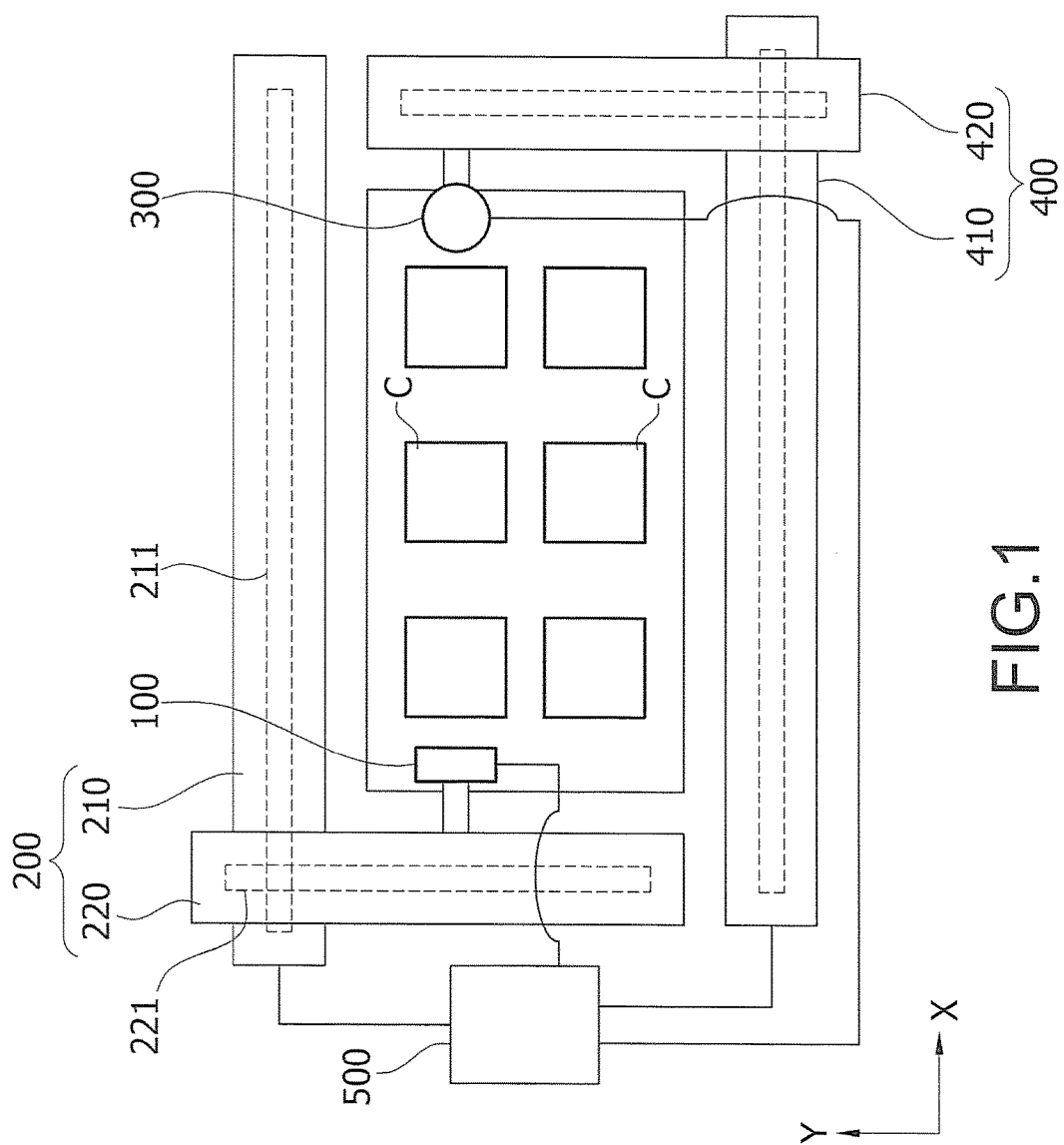
FIG. 1 is a schematic view of a pump position feedback type dispenser according to an embodiment of the present invention.
Figure 2:
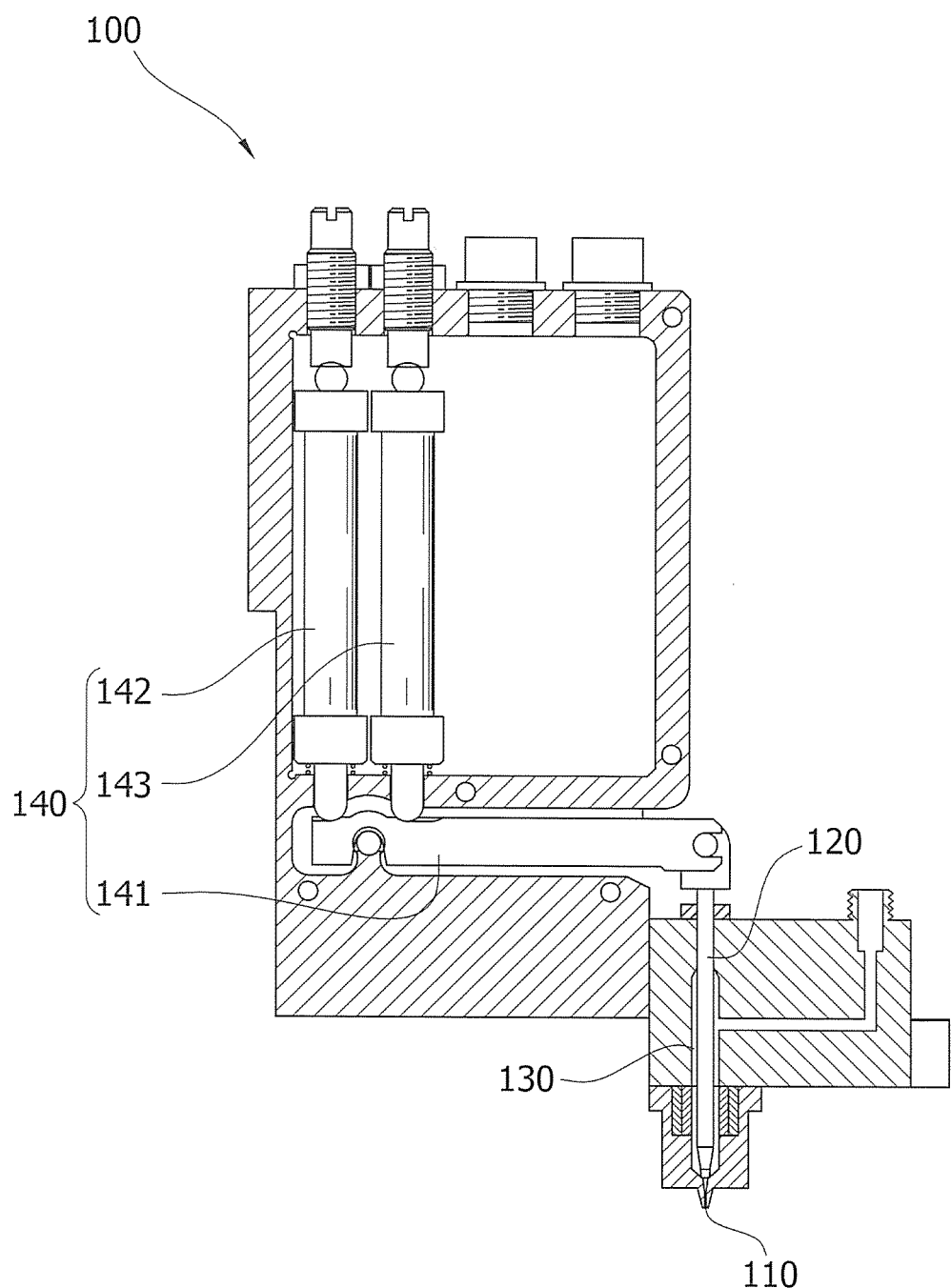
FIG. 2 is a cross-sectional view of a pump of the pump position feedback type dispenser illustrated in FIG. 1.

FIG. 1 is a schematic view of a pump position feedback type dispenser according to an embodiment of the present invention, and FIG. 2 is a cross-sectional view of a pump of the pump position feedback type dispenser illustrated in FIG. 1.

Referring to FIGS. 1 and 2, the pump position feedback type dispenser according to the present invention includes a pump 100, a pump moving unit 200, a camera 300, and a control unit 500.

The pump position feedback type dispenser according to the present invention is an apparatus for coating a plurality of works with a viscous liquid by using the pump 100. In the pump position feedback type dispenser according to the present invention, various types of pumps may be used. For example, in the present embodiment, the pump 100, which is a piezoelectric pump having a structure as illustrated in FIG. 2 is used to dispense a viscous liquid to a work in the form of a semiconductor chip C.

Referring to FIG. 2, the pump 100 according to the present embodiment includes a nozzle 110, a reservoir 130, a valve rod 120, and an updown unit 140. The reservoir 130 stores a viscous liquid to be dispensed to a work. The nozzle 110 is disposed under the reservoir 130 so that the viscous liquid is ejected through the nozzle 110. The valve rod 120 is liftably inserted into the reservoir 130. The updown unit 140 moves up and down the valve rod 120 relative to the reservoir 130 at a high speed. As the valve rod 120 is rapidly lowered via the updown unit 140, a pressure and moment are generated so that a portion of the viscous liquid in the reservoir 130 is discharged through the nozzle 110 to the outside.

The updown unit 140 moving the valve rod 120 may have various structures. In the present embodiment, description will focus on the updown unit 140 having a structure as illustrated in FIG. 2.

The updown unit 140 according to the present embodiment includes piezoelectric actuators 142 and 143 and a lever 141. The piezoelectric actuators 142 and 143 contract or expand in length according to a voltage applied thereto via the control unit 500. According to the present embodiment, the two piezoelectric actuators 142 and 143 are disposed with a rotational axis of the lever 141 therebetween. As the two piezoelectric actuators 142 and 143 alternately expand or contract, the lever 141 rotates while changing its direction around the rotational axis. The valve rod 120 is connected to an end portion of the lever 141. When the lever 141 rotates according to operation of the piezoelectric actuators 142 and 143, the valve rod 120 connected to the lever 141 is lifted or lowered.

The updown unit may have other various structures besides the above-described structure, for example, a structure including a cam, a structure using a pneumatic pressure or a structure using an electromagnet.

The pump 100 is mounted on the pump moving unit 200 to be moved. Works, to which a viscous liquid is to be dispensed, are disposed below the pump 100. According to the present embodiment, description will focus on an "underfill process" in which a viscous liquid is coated along a portion of an outer circumference of a semiconductor chip C so that the viscous liquid is filled under a lower surface of the semiconductor chip C.

The pump moving unit 200 includes a first pump moving portion 210 and a second pump moving portion 220 each configured in the form of a linear motor. The first pump moving portion 210 and the second pump moving portion 220 transport the pump 100 in an X direction and a Y direction, respectively. The pump 100 dispenses a viscous liquid while moving relative to works along a preset path via the pump moving unit 200 having the above-described structure. The first pump moving portion 210 and the second pump moving portion 220 of the pump moving unit 200 have linear encoders 211 and 221, respectively. The linear encoders 211 and 221 determine a position of the pump 100 in real time to generate an electric signal. The position of the pump 100 determined in real time by the linear encoders 211 and 221 of the pump moving unit 200 will be referred to as a 'pump position signal' below.

The camera 300 is disposed above the works (semiconductor chips C) to capture images of the works. By using image information of images captured by using the camera 300 described above, the control unit 500 may determine accurate positions of the works. The camera may be fixed and simultaneously capture images of a plurality of works and determine respective positions of the works based on the images. However, in the present embodiment, description will focus on the camera 300 that is movable via a camera moving unit 400 as illustrated in FIG. 1.

The camera moving unit 400 includes a first camera moving portion 410 and a second camera moving portion 420. The first camera moving portion 410 and the second camera moving portion 420 transport the camera 300 in an X direction and a Y direction, respectively. As the camera moving unit 400 transports the camera 300, the camera 300 captures images of the semiconductor chips C therebelow.

The control unit 500 controls operations of the camera 300, the pump 100, the pump moving unit 200, and the camera moving unit 400. Image information of images captured using the camera 300 is transmitted to the control unit 500. The control unit 500 calculates accurate positions of the semiconductor chips C based on the image information received from the camera 300. The control unit 500 may already have information about approximate positions of the semiconductor chips C but actual positions and angles of the semiconductor chips C disposed below the pump 100 may vary each time due to various reasons. After moving the camera 300 to positions above the semiconductor chips C by operating the camera moving unit 400, the control unit 500 determines accurate positions and directions of the semiconductor chips C by capturing images of the semiconductor chips C. Then, based on the accurate positions of the semiconductor chips C calculated by the control unit 500, the control unit 500 may calculate a position to which or a path along which a viscous liquid is to be dispensed. The control unit 500 transmits a pump operation signal to the updown unit 140 of the pump 100 based on a result of calculation so as to calculate pump operation positions $P_1$, at which the pump 100 is to be operated. A position, at which the control unit 500 is to generate an operation signal of the updown unit 140, will be referred to as a 'pump operation position' below.

The control unit 500 operates the pump moving unit 200 such that the pump 100 is moved along the pump operation positions $P_1$. The control unit 500 receives a pump position signal from the linear encoders 211 and 221 in real time so that the control unit 500 generates a pump operation signal every time the pump 100 reaches the pump operation positions $P_1$.

Hereinafter, a pump position feedback type dispensing method according to an embodiment of the present invention, performed using the pump position feedback type dispenser having the above-described structure will be described.

First, images of a plurality of semiconductor chips C disposed below the pump 100 are captured using the camera 300 in step (a). The control unit 500 operates the camera moving unit 400 to capture images of the semiconductor chips C while moving along a path along which the semiconductor chips C are anticipated to be present.

Figure 3:
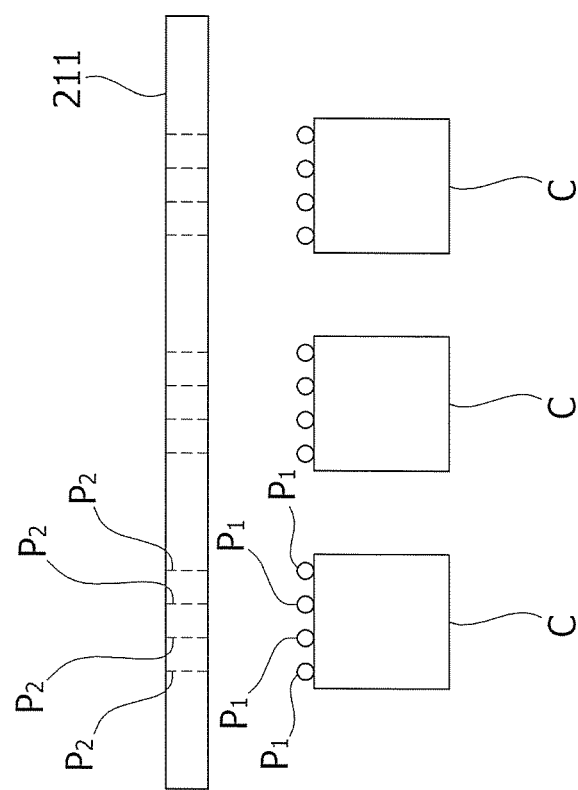
FIGS. 3 and 4 are diagrams for describing an operation of the pump position feedback type dispenser illustrated in FIG. 1 and a pump position feedback type dispensing method according to an embodiment of the present invention.

The control unit 500 calculates positions of the semiconductor chips C based on the image information received from the camera 300, and operates the updown unit 140 of the pump 100 according to the calculated positions of the semiconductor chips C, thereby calculating pump operation positions $P_1$, at which a pump operation signal for ejecting a viscous liquid L is to be generated, in step (b). The control unit 500 may determine accurate positions and directions of the semiconductor chips C by using images of the actual arrangement of the semiconductor chips C as described above. By using the positions and directions of the semiconductor chips C determined as described above, the control unit 500 may calculate a pump operation position $P_1$, at which a viscous liquid L is to be ejected from the nozzle 110 by operating the updown unit 140 as illustrated in FIG. 3. In an underfill process, a viscous liquid L is typically dispensed along a lateral side of the semiconductor chips C, and thus, a plurality of pump operation positions $P_1$ as described above are calculated based on a path of the pump 100 and an amount of the viscous liquid L needed for coating.

Next, the control unit 500 transports the pump 100 along a path, along which the viscous liquid L is to be dispensed with respect to the semiconductor chips C, and the linear encoders 211 and 221 determine a position of the pump 100 in real time and generates a pump position signal in step (c). The control unit 500 does not give a command to direct the pump 100 to move to a particular position via an open loop method, but instead, while the control unit 500 continuously receives pump position signals of the linear encoders 211 and 221, the pump moving unit 200 operates such that the control unit 500 monitors movement of the pump 100 to the pump operation position $P_1$ and also whether the pump 100 is exactly at the pump operation position $P_1$.

Figure 4:
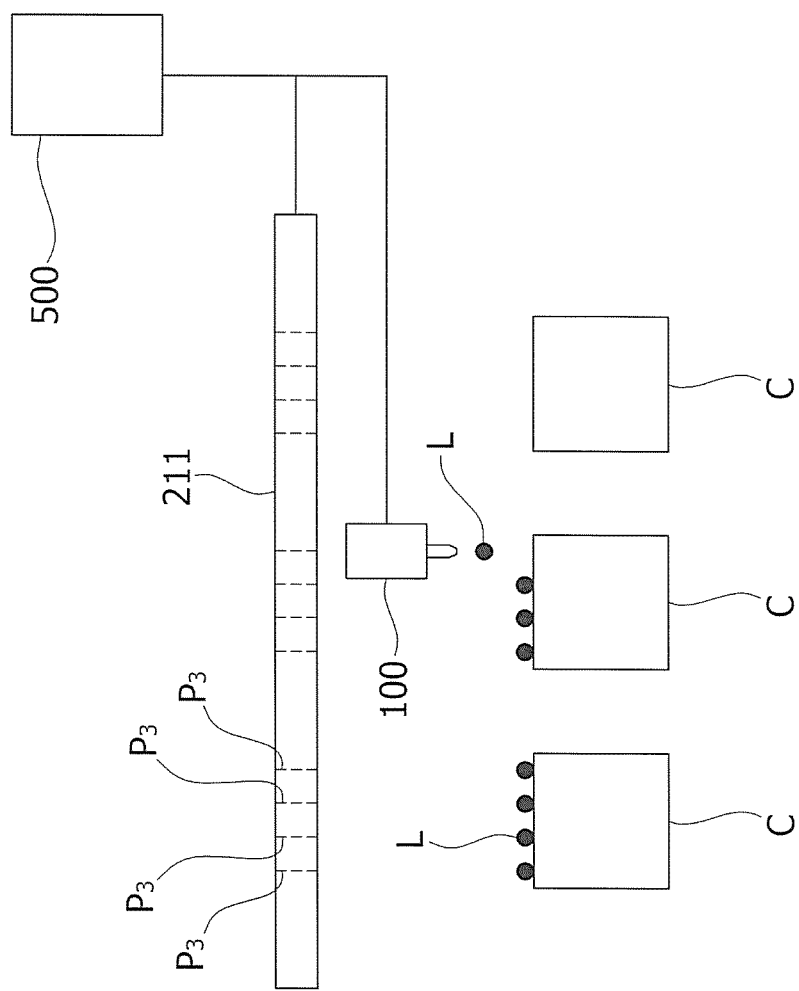

Next, in step (d), as illustrated in FIG. 4, when it is determined that the pump 100 has reached the pump operation positions as the control unit 500 receives a pump position signal from the linear encoders 211 and 221, the control unit 500 generates a pump operation signal to operate the updown unit 140 to thereby eject the viscous liquid L through the nozzle 110.

In detail, step (d) is performed in a following manner.

First, in step (d-1), as illustrated in FIG. 3, the control unit 500 converts the pump operation positions $P_1$ into values $P_2$ corresponding to the pump position signals generated in the linear encoders 211 and 221.

Next, the pump position signals generated in the linear encoders 211 and 221 in real time and the pump operation positions are compared in step (d-2). As the pump operation positions $P_1$ are converted in advance into the same form of the pump position signals of the linear encoders 211 and 221, the values $P_2$ may be quickly compared with the pump position signals in real time.

As illustrated in FIG. 4, if a value $P_3$ of the pump position signal (that is, a position of the pump 100 that the linear encoders 211 and 221 transmitted) and the pump operation position $P_1$ correspond to each other, the control unit 500 generates a pump operation signal in step (d-3).

As described above, the viscous liquid L may be dispensed at a desired position quickly and accurately by operating the pump 100 while checking an actual position of the semiconductor chips C and a current position of the pump 100 in real time.

Meanwhile, when the pump moving unit 200 is operated to transport the pump 100 at a constant speed in step (c), a position $P_3$, at which a next pump operation signal of the pump 100 is to be generated, and a time when the next pump operation signal is to be generated may be easily predicted in real time and calculated. In particular, each time when a dispensing process for one semiconductor chip is completed and a new dispensing process starts with a next semiconductor chip C, the pump 100 may not be halted but move continuously at a constant speed and dispense the viscous liquid L quickly at accurate positions. Accordingly, the total operation speed may be increased, thereby enhancing productivity.

Meanwhile, when using the pump 100 including the piezoelectric actuators 142 and 143 as in the present embodiment, a temporal difference between a time when the control unit 500 generates a pump operation signal and a time when the viscous liquid L is actually ejected through the nozzle 110 (operation time difference) is very small. Accordingly, without considering an operation time difference, the viscous liquid L may be disposed at an accurate position even when the control unit 500 generates a pump operation signal at a time when the pump 100 has reached a pump operation position.

Alternatively, according to circumstances, a relatively great operation time difference may be caused according to the structure of the pump 100, a viscosity of the viscous liquid L, and a coating amount of the viscous liquid L. In this case, tests may be conducted to measure or calculate an operation time difference, and then a pump operation signal corresponding to the operation time difference may be generated in advance to thereby further increase accuracy in positions where the viscous liquid L is to be coated. In particular, as described above, when the pump 100 is transported while maintaining a constant speed of the pump 100, a time when the pump reaches the pump operation position may be predicted so as to easily generate a pump operation signal corresponding to an operation time difference in advance.

As described above, when operating the pump 100 while moving the pump 100 at the same speed both along a path along which the viscous liquid L is dispensed to the semiconductor chips C by using the pump 100 and a path along which the viscous liquid L is not dispensed, a position where dispensing of the viscous liquid L starts may be accurately set.

While the prevent invention has been described with reference to preferred embodiments, the scope of the present invention is not limited to the above described and illustrated structures.

For example, while the camera 300 is described above as being moved via the camera moving unit 400 and as capturing images of works, a pump position feedback type dispenser that does not include the camera moving unit 400 may also be configured. In addition, a pump position feedback type dispenser may be configured by mounting a camera on a pump moving unit so that the camera and a pump move together via the pump moving unit. According to circumstances, a pump position feedback type dispenser may be configured such that the camera is fixed and configured to capture images of works without using the camera moving unit 400 or the pump moving unit 200.

In addition, the pump may also have other various structures than the structure illustrated in FIG. 2.

According to the pump position feedback type dispenser and dispensing method of the present invention, a process of coating a viscous liquid is performed by considering an actual position and angle of a work to be coated, thereby improving accuracy of the position of the work where the viscous liquid is to be coated.

In addition, according to the pump position feedback type dispenser and dispensing method of the present invention, the process of coating a work with a viscous liquid may be performed accurately and quickly.

While one or more exemplary embodiments have been described with reference to the figures, it will be understood by those of ordinary skill in the art that various changes in form and details may be made therein without departing from the spirit and scope of the inventive concept as defined by the following claims.

What is claimed is:

1. A pump position feedback type dispensing method performed using a pump comprising a nozzle, a reservoir connected to the nozzle and storing a viscous liquid to be ejected through the nozzle, a valve rod that is liftably inserted into the reservoir, and an updown unit for moving the valve rod with respect to the reservoir so that the viscous liquid is ejected through the nozzle, the method comprising:
 (a) obtaining image information by capturing images of a plurality of works disposed below the pump, by using a camera;
 (b) calculating positions of the plurality of works based on the image information and calculating pump operation positions to generate a pump operation signal, via which the viscous liquid is ejected according to an operation of the updown unit of the pump;
 (c) determining a position of the pump by using linear encoders in real-time while transporting the pump along a path, along which the viscous liquid is to be dispensed to the works, and generating a pump position signal; and
 (d) when it is determined that the pump has reached the pump operation positions as the control unit receives the pump position signal from the linear encoders, generating, performed by the control unit, the pump operation signal so as to eject the viscous liquid through the nozzle via an operation of the updown unit, wherein in (d), by considering an operation time difference between a time when the pump operation signal is generated and a time when the viscous liquid is ejected from the nozzle via the pump operation signal, the pump operation signal corresponding to the operation time difference is generated before the pump reaches the pump operation position.

2. The method of claim 1, wherein the updown unit of the pump comprises a piezoelectric actuator having a shape changing according to an applied voltage, and a lever connecting the piezoelectric actuator and the valve rod.

3. The method of claim 1, wherein (c) is performed while transporting the pump at a constant speed.

4. The method of claim 1, wherein in (a), images of the works are captured while moving the camera.

5. The method of claim 1, wherein (d) comprises:
 (d-1) converting the pump operation positions into values corresponding to a pump position signal generated in the linear encoders;
 (d-2) comparing the pump position signal generated in the linear encoders in real time with the pump operation position; and
 (d-3) generating the pump operation signal if the pump position signal and the pump operation positions correspond to each other.

* * * * *